United States Patent
Wu et al.

(10) Patent No.: US 7,821,068 B2
(45) Date of Patent: Oct. 26, 2010

(54) DEVICE AND PROCESS INVOLVING PINHOLE UNDERCUT AREA

(75) Inventors: Yiliang Wu, Mississauga (CA); Ping Liu, Mississauga (CA); Yuning Li, Mississauga (CA); Hualong Pan, Ottawa (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/193,249

(22) Filed: Aug. 18, 2008

(65) Prior Publication Data
US 2010/0038714 A1 Feb. 18, 2010

(51) Int. Cl.
*H01L 21/28* (2006.01)
(52) U.S. Cl. .................. 257/347; 257/40; 257/288; 257/621; 257/E51.006
(58) Field of Classification Search ............ 257/40, 257/288, 347, 621, E51.005; 438/149
See application file for complete search history.

(56) References Cited

U.S. PATENT DOCUMENTS

| | | | | |
|---|---|---|---|---|
| 5,436,182 A | * | 7/1995 | Konya et al. | 438/30 |
| 5,576,569 A | * | 11/1996 | Yang et al. | 257/321 |
| 6,765,279 B2 | * | 7/2004 | Leedy | 257/506 |
| 7,176,071 B2 | | 2/2007 | Takehiro | |
| 7,709,302 B2 | * | 5/2010 | Nakajima | 438/149 |
| 2002/0011627 A1 | * | 1/2002 | Takemura et al. | 257/351 |
| 2006/0073613 A1 | * | 4/2006 | Aggarwal et al. | 438/3 |
| 2006/0138427 A1 | * | 6/2006 | Yamazaki et al. | 257/72 |
| 2007/0063180 A1 | * | 3/2007 | Asano et al. | 257/3 |
| 2007/0128758 A1 | * | 6/2007 | Tanaka et al. | 438/50 |
| 2007/0247064 A1 | * | 10/2007 | Hosokawa | 313/504 |
| 2010/0006826 A1 | * | 1/2010 | Dimmler | 257/40 |

\* cited by examiner

*Primary Examiner*—Thanh V Pham
*Assistant Examiner*—Duy T Nguyen
(74) *Attorney, Agent, or Firm*—Fay Sharpe LLP

(57) ABSTRACT

An electronic device fabrication method including: (a) providing a dielectric region and a lower electrically conductive region, wherein the dielectric region includes a plurality of pinholes each with an entry and an exit; and (b) depositing an etchant for the lower electrically conductive region into the pinholes that undercuts the pinholes to create for a number of the pinholes an overhanging surface of the dielectric region around the exit facing an undercut area of the lower electrically conductive region wider than the exit.

13 Claims, 3 Drawing Sheets

DEVICE AND PROCESS INVOLVING PINHOLE UNDERCUT AREA

BACKGROUND OF THE INVENTION

In recent years, there have been tremendous interest in organic thin film transistors (OTFTs), which promise applications such as RFID tags and liquid crystal displays, because fabricating OTFTs using solution processes such as spin-coating and jet-printing represents a low-cost manufacturing option compared to conventional costly photolithography. A desirable gate dielectric for OTFTs should have a very low gate leakage current (pinhole free) and high capacitance. To achieve high device yield, a considerable dielectric thickness (e.g., >500 nm) is typically used to reduce pinhole density, thus gate leakage current to an acceptable level. To achieve high capacitance, on the other hand, a thin dielectric layer (e.g., <300 nm) is preferred, since solution processable polymeric gate dielectrics usually have low dielectric constants. Therefore, there is a need for processes to make a thin dielectric layer having both high device yield and low gate leakage. However, OTFTs with a thin gate dielectric typically have high leakage and low yield due to pinholes. Thus, there is a need addressed by embodiments of the present invention for new electronic devices and new electronic device fabrication methods where the deleterious effects of pinholes are reduced.

The following documents provide background information:

Takehiro, U.S. Pat. No. 7,176,071 B2.

SUMMARY OF THE DISCLOSURE

In embodiments, there is provided an electronic device fabrication method comprising: (a) providing a dielectric region and a lower electrically conductive region, wherein the dielectric region includes a plurality of pinholes each with an entry and an exit; and (b) depositing an etchant for the lower electrically conductive region into the pinholes that undercuts the pinholes to create for a number of the pinholes an overhanging surface of the dielectric region around the exit facing an undercut area of the lower electrically conductive region wider than the exit.

In other embodiments, there is provided an electronic device comprising: (a) a dielectric region including a plurality of pinholes each with an entry and an exit; and (b) a lower electrically conductive region, wherein at least some of the pinholes are undercut with an overhanging surface of the dielectric region around the exit facing an undercut area of the lower electrically conductive region wider than the exit.

In further embodiments, there is provided a thin film transistor comprising: (a) a dielectric region including a plurality of pinholes each with an entry and an exit; and (b) a lower electrically conductive region, wherein at least some of the pinholes are undercut with an overhanging surface of the dielectric region around the exit facing an undercut area of the lower electrically conductive region wider than the exit.

BRIEF DESCRIPTION OF THE DRAWINGS

Other aspects of the present invention will become apparent as the following description proceeds and upon reference to the following figures which are representative embodiments.

Unless otherwise noted, the same reference numeral in different Figures refers to the same or similar feature.

DETAILED DESCRIPTION

Figure 1:
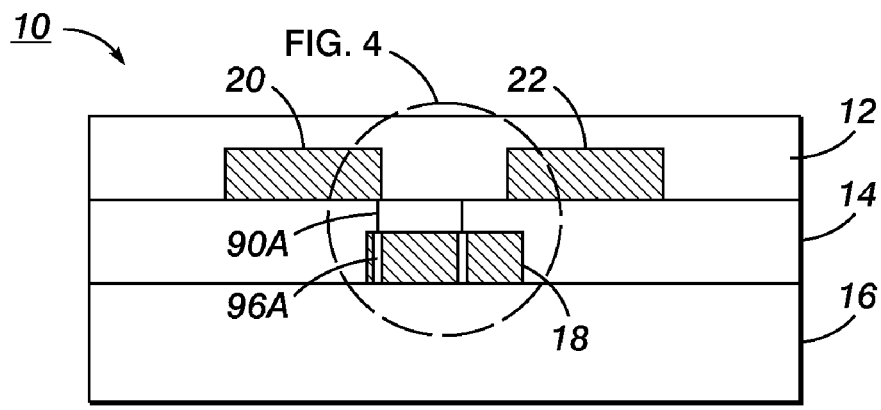
FIG. 1 represents a first embodiment of the present invention in the form of a TFT.

The term "region" can be any suitable configuration such as a single layer or two or more layers of the same or different composition, where the two or more layers can be coterminous such as a dual-layer dielectric structure or partially coterminous such as a semiconductor layer contacting a source electrode and a drain electrode.

The phrase "lower electrically conductive region" refers to a semiconductor region and/or a number of electrodes (e.g., one, two, or more electrodes).

The phrase "upper electrically conductive region" refers to a semiconductor region and/or a number of electrodes (e.g., one, two, or more electrodes).

The pinhole undercut area approach can be used with any suitable electronic device. The phrase "electronic device" encompasses for instance the following: (1) electronic components such as for example a thin film transistor, a capacitor, and the like; and (2) electronic systems including such electronic components (e.g., transistor and/or capacitor) such as for example displays, imaging devices, sensors, and the like.

In embodiments, a thin film transistor typically comprises three electrodes (a gate electrode, a source electrode and a drain electrode), a dielectric region (for example, a gate dielectric), a semiconductor region, a supporting substrate, and an optional protecting region.

FIGS. 1-6 are illustrative embodiments of suitable thin film transistor structural configurations. FIGS. 1-6 are merely illustrative of possible configurations for the various layers of a thin film transistor and are not intended to be limiting in any manner.

Although specific terms are used in the following description for the sake of clarity, these terms are intended to refer only to the particular structure of the embodiments selected for illustration in the drawings, and are not intended to restrict or limit the scope of the disclosure.

In FIG. 1, there is schematically illustrated an organic thin film transistor ("OTFT") configuration 10 comprised of a substrate 16, in contact therewith a metal contact 18 (gate electrode) and a layer of a gate dielectric 14 on top of which two metal contacts, source electrode 20 and drain electrode 22, are deposited. Over and between the metal contacts 20 and 22 is a semiconductor layer 12 as illustrated herein. Pinhole 90A and undercut area 96A are shown.

Figure 2:
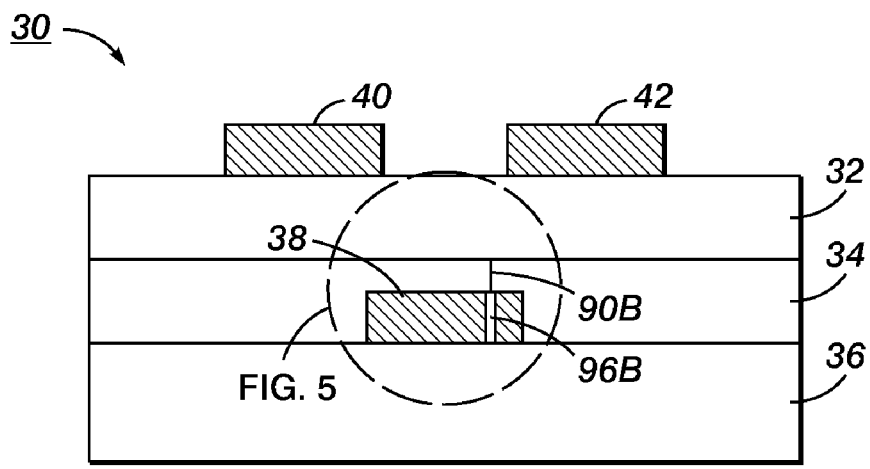
FIG. 2 represents a second embodiment of the present invention in the form of a TFT.

FIG. 2 schematically illustrates another OTFT configuration 30 comprised of a substrate 36, a gate electrode 38, a source electrode 40 and a drain electrode 42, a gate dielectric 34, and a semiconductor layer 32. Pinhole 90B and undercut area 96B are shown.

Figure 3:
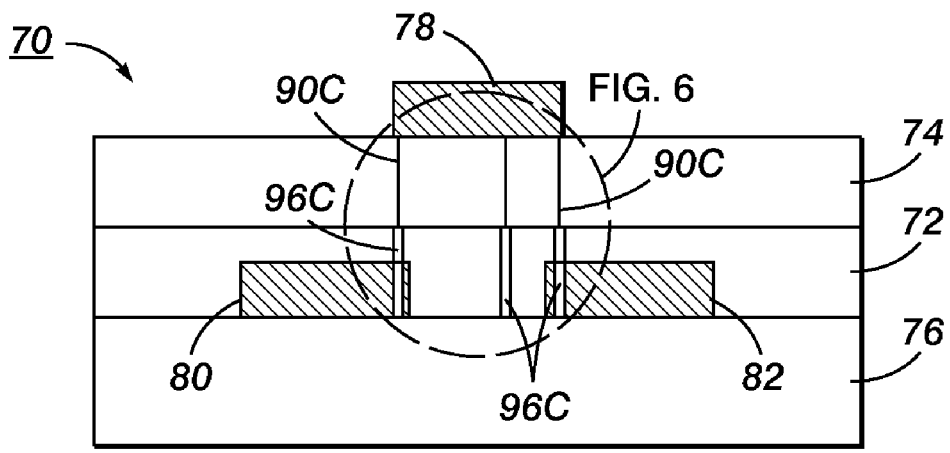
FIG. 3 represents a third embodiment of the present invention in the form of a TFT.

FIG. 3 schematically illustrates an additional OTFT configuration 70 comprised of substrate 76, a gate electrode 78, a source electrode 80, a drain electrode 82, a semiconductor layer 72, and a gate dielectric 74. Pinhole 90C and undercut area 96C are shown.

Figure 4:
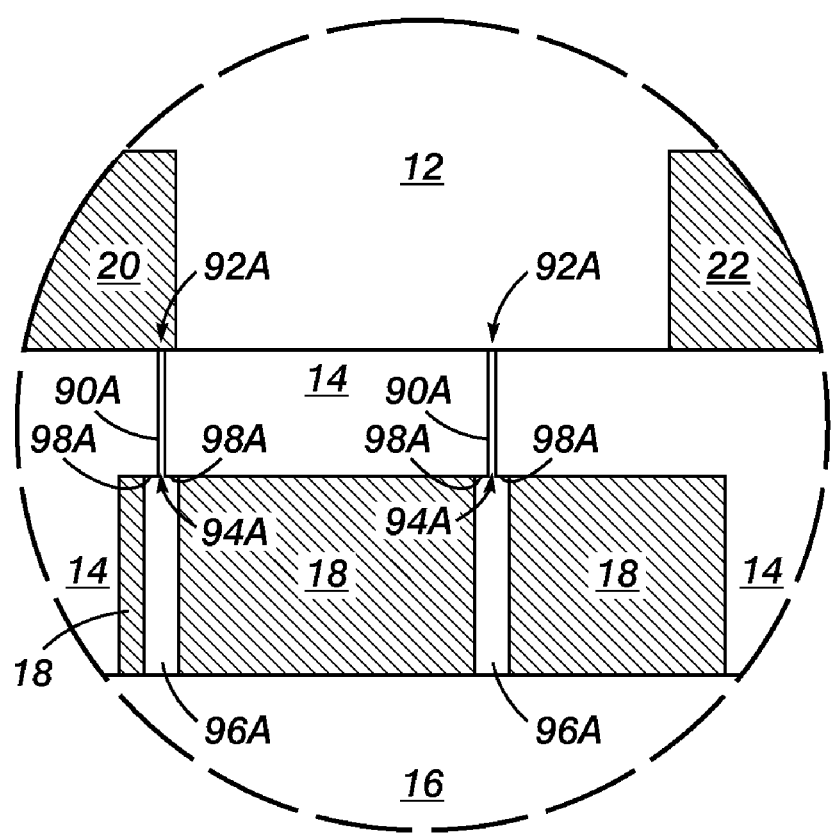
FIG. 4 represents an enlarged view of a portion of the TFT of FIG. 1.
Figure 5:
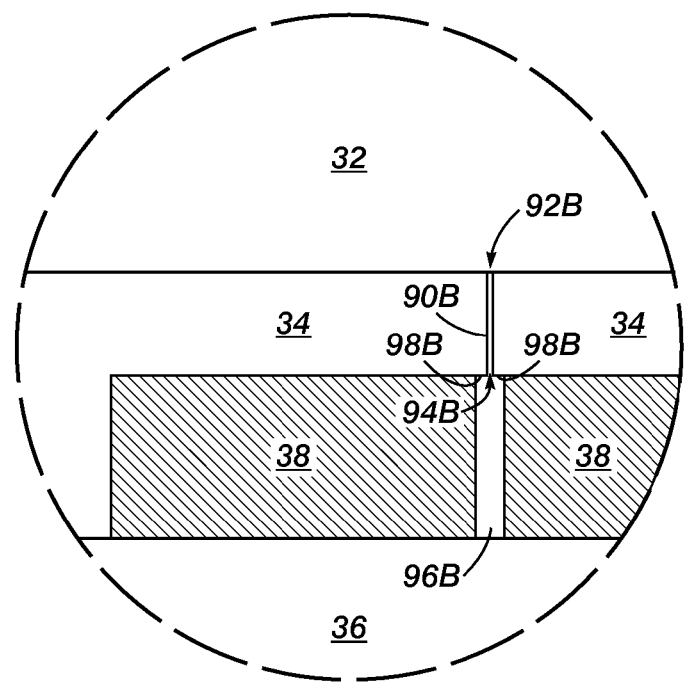
FIG. 5 represents an enlarged view of a portion of the TFT of FIG. 2.
Figure 6:
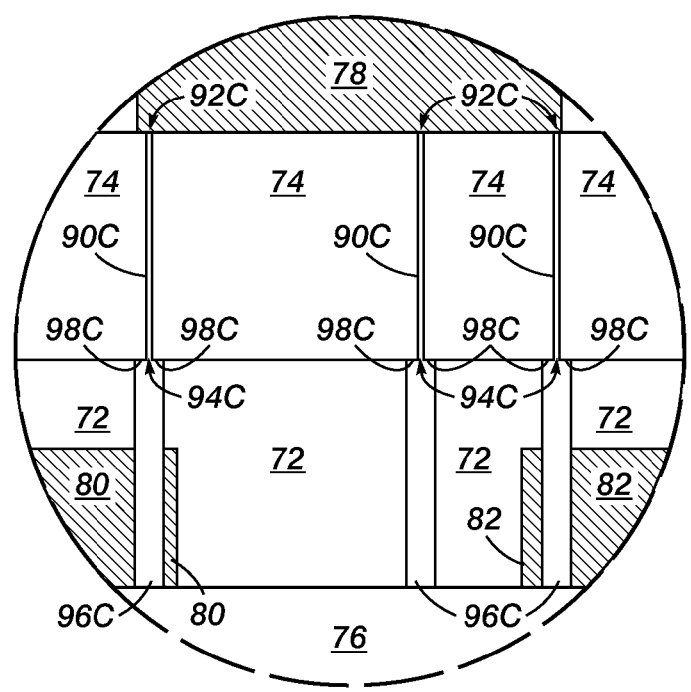
FIG. 6 represents an enlarged view of a portion of the TFT of FIG. 3.

FIGS. 4-6 depict pinhole (90A, 90B, 90C) with entry (92A, 92B, 92C) and exit (94A, 94B, 94C), the undercut area (96A, 96B, 96C), and the overhanging surface (98A, 98B, 98C).

For simplicity, in FIGS. 1-6, no upper electrically conductive region material is depicted in the pinhole and undercut area.

In some embodiments of the present disclosure, an optional protecting layer may also be included. For example, such an optional protecting layer may be incorporated on the top of each of the transistor configurations of FIGS. 1-3. The protecting layer may comprise for example silicon oxide, silicon nitride, poly(methyl methyacrylate), polyester, polyimide, or polycarbonate, or a mixture there.

Dielectric Region

The dielectric region also can be referred to as an insulating region. In embodiments involving for instance a thin film transistor, the dielectric region can be referred to as a gate dielectric. The dielectric region can be composed of organic and/or inorganic materials. Illustrative examples of inorganic materials suitable for the dielectric region include silicon oxide, silicon nitride, aluminum oxide, barium titanate, barium zirconium titanate and the like; illustrative examples of organic polymers for the dielectric region include polyesters, polycarbonates, poly(vinyl phenol), polyimides, polystyrene, poly(methacrylate)s, poly(acrylate)s, epoxy resin and the like. In embodiments, the dielectric region includes polymeric dielectric material(s). The dielectric region can be formed by any suitable methods such as plasma enhanced chemical vapor deposition, sputtering, liquid deposition methods including spin coating, dip coating, bar coating, printing such as ink jet, screen, flexography, and gravure printing. In preferred embodiments, the dielectric region is formed by liquid deposition methods. The thickness of the dielectric region is, for example from about 10 nm to about 1000 nm depending on the dielectric constant of the dielectric material used. A representative thickness of the dielectric region is from about 100 nm to about 500 nm. The dielectric region may have a conductivity that is for example less than about $10^{-12}$ S/cm or less than about $10^{-10}$ S/cm.

The dielectric region may be a single layer or may be multilayered. Each layer of the single layer/multilayer gate dielectric has a thickness of for example from about 5 nanometers to about 1 micrometer. In other embodiments each layer of the single layer/multilayer dielectric region has a thickness of for example from about 100 nanometers to about 1 micrometer. The thickness can be determined by known techniques such as ellipsometry and profilometry.

Substrate

The substrate may be composed of for instance silicon, glass plate, plastic film or sheet. For structurally flexible devices, a plastic substrate, such as for example polyester, polycarbonate, polyimide sheets and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass plate or silicon wafer.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, silver, titanium, copper, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors. In embodiments, the gate electrode is patterned.

The source and drain electrodes can be fabricated from materials which provide a low resistance ohmic contact to the semiconductor layer. Typical materials suitable for use as source and drain electrodes include those of the gate electrode materials such as gold, nickel, silver, aluminum, platinum, conducting polymers and conducting inks. Typical thicknesses of source and drain electrodes are about, for example, from about 40 nanometers to about 10 micrometers with the more specific thickness being about 100 to about 400 nanometers.

While the terms gate electrode, source electrode and drain electrode refer to electrodes typically used in thin film transistors, electrodes used in other types of electronic devices are encompassed by embodiments of the present invention using the electrode materials, thicknesses, and fabrication methods described herein.

Suitable electrode materials include for instance aluminum, chromium, copper, gold, indium, nickel, platinum, silver, titanium, and a mixture thereof.

Semiconductor Region

In embodiments, the semiconductor region is referred to as a semiconductor layer. Materials suitable for use as an organic semiconductor region include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor region is formed from a liquid processable material. Illustrative examples of suitable semiconductor materials include polythiophenes, oligothiophenes, and the semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also totally incorporated herein by reference.

The semiconductor region may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor region is formed by a liquid deposition method. In embodiments, the semiconductor region has a thickness of from about 10 nanometers to about 1 micrometer. In further embodiments, the semiconductor region has a thickness of from about 30 to about 150 nanometers. In other embodiments the semiconductor region has a thickness of from about 40 to about 100 nanometers.

The gate dielectric, the gate electrode, the semiconductor region, the source electrode, and the drain electrode are formed in any sequence. In embodiments the gate electrode and the semiconductor region are both in contact with the gate dielectric, and the source electrode and the drain electrode are both in contact with the semiconductor region. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

Undercut Area

Any suitable etchant for the lower electrically conductive region may be used. The etchant more rapidly etches the lower electrically conductive region than the dielectric region (that is, preferential etching of the lower electrically conductive region). In embodiments, there is insignificant or no etching by the etchant on the dielectric region. Representative etchants include the following: acid such as HF, $HNO_3$, HCl, $H_2SO_4$, and acetic acid, base such as KOH, NaOH, and $NH_3OH$, $H_2O_2$, $(NH_4)_2S_2O_4$, and the mixture thereof. For example, different metals can be etched with different combination of above etchants. The following Table 1 summarizes typical etchants for common metals.

TABLE 1

("Hot" refers to a temperature above about 50 degrees C)

| Metal | Etchant | Ratio (Vol) | Remarks |
|---|---|---|---|
| Aluminum | $H_2O/HF$ | 1:1 | |
| Aluminum | $HCl/HNO_3/HF$ | 1:1:1 | |
| Antimony | $H_2O/HCl/HNO_3$ | 1:1:1 | |
| Antimony | $H_2O/HF/HNO_3$ | 90:1:10 | |
| Bismuth | $H_2O/HF$ | 10:1 | |
| Chromium | $H_2O/H_2O_2$ | 3:1 | |
| Copper | $H_2O/HNO_3$ | 1:5 | |
| Gold | $HCl/HNO_3$ | 3:1 | Hot |
| Indium | $HCl/HNO_3$ | 3:1 | Hot |
| Iron | $H_2O/HCl$ | 1:1 | |
| Nickel | $HNO_3$/Acetic acid/acetone | 1:1:1 | |
| Nickel | $HF/HNO_3$ | 1:1 | |
| Platinum | $HCl/HNO_3$ | 3:1 | Hot |
| Silver | $NH_3OH/H_2O_2$ | 1:1 | |
| Titanium | $H_2O/HF/HNO_3$ | 50:1:1 | |
| Titanium | $H_2O/HF/H_2O_2$ | 20:1:1 | |

Commercially available etchants such as the etchants from Transene Company Inc. and their compatibility with metals are listed in the following Table 2.

TABLE 2

| Etchants | Al | Au | Cr | Cu | Ni | Si | $Si_3N_4$ | $SiO_2$ | Ti | W | GaAs | Ta/TaN |
|---|---|---|---|---|---|---|---|---|---|---|---|---|
| Aluminum A | etch | ok | etch | etch | etch | surf ox | slight | ok | ok | ok | etch | surf ox |
| Aluminum D | etch | ok | slight | ok | ok | ok | slight | ok | ok | ok | ok | ok |
| Chromium Etch 1020 | etch | ok | etch | etch | etch | surf ox | ok | ok | ok | ok | etch | surf ox |
| Chromium Etch CRE-473 | etch | ok | etch | etch | slight | ok | ok | ok | etch | ok | etch | ok |
| Chromium Etch TFD | etch | ok | etch | etch | etch | surf ox | ok | ok | ok | ok | etch | surf ox |
| Copper Etch 100 | etch | ok | slight | etch | etch | ok | ok | ok | slight | ok | etch | ok |
| Copper Etch 200 | etch | ok | slight | etch | etch | ok | ok | ok | slight | ok | etch | ok |
| Copper Etch APS-100 | ok | ok | ok | etch | etch | ok | ok | ok | ok | slight | NA | ok |
| GE-8110 | etch | etch | ok | corrode | ok | ok | ok | ok | ok | ok | etch | ok |
| GE-8111 | etch | etch | ok | corrode | ok | ok | slight | ok | ok | ok | etch | ok |
| GE-8148 | etch | etch | ok | corrode | ok | ok | ok | ok | ok | ok | etch | ok |
| Gold Etch TFA | etch | etch | ok | corrode | slight | ok | ok | ok | ok | ok | etch | ok |
| Nichrome Etch TFC | etch | ok | etch | etch | etch | surf ox | ok | ok | ok | ok | etch | surf ox |
| Nichrome Etch TFN | etch | ok | etch | etch | etch | surf ox | ok | ok | ok | ok | etch | surf ox |
| Nickel Etch TFB | etch | ok | etch | etch | etch | surf ox | ok | ok | ok | ok | etch | surf ox |
| Nickel Etch TFG | etch | ok | ok | ok | etch | ok | ok | ok | ok | ok | ok | ok |
| Nickel Etch Type I | etch | ok | slight | etch | etch | ok | ok | ok | slight | ok | etch | ok |
| Silver Etch TFS | etch | etch | ok | corrode | slight | ok | ok | ok | ok | ok | etch | ok |
| Tantalum Nitride Etch III | etch | ok | etch | etch | etch | etch | ok | etch | etch | ok | etch | etch |
| Tantalum Nitride SIE-8607 | etch | ok | etch | etch | etch | etch | ok | etch | etch | ok | etch | etch |
| Titanium Etch TFT | etch | ok | etch | ok | ok | ok | etch | etch | etch | ok | ok | ok |
| Titanium Etch TFTN | etch | ok | etch | slight | slight | ok | ok | ok | etch | ok | etch | ok |

TABLE 2-continued

| Etchants | Al | Au | Cr | Cu | Ni | Si | Si$_3$N$_4$ | SiO$_2$ | Ti | W | GaAs | Ta/TaN |
|---|---|---|---|---|---|---|---|---|---|---|---|---|
| Ti-Tungsten TiW-30 | ok | ok | ok | etch | slight | ok | ok | ok | slight | slight | etch | ok |
| Tungsten Etch TFW | etch | ok | etch | ok | ok | slight | ok | slight | ok | etch | etch | ok | wherein etch = significant attack, slight = slight attack, ok = no attack, surf ox = only attack surface oxidation, corrode = surface corrosion.

The etchant can etch through the entire thickness or only a portion of the thickness of the lower electrically conductive region, where the removed section of the lower electrically conductive region corresponds to the undercut area. For example, where the lower electrically conductive region comprises both the semiconductive layer and electrodes, the etchant can etch through one or both of the semiconductor layer and electrodes. In embodiments, the lower electrically conductive region functions as a component of the electronic devices such as gate electrode of thin film transistors. The undercut area is only a small portion of the lower electrically conduction region; therefore, after undercut, the lower electrically conductive region can still function properly. In one example, after the undercut process, the lower electrically conductive region is still a continuous region, but with small holes in the region. In other words, the present process will not separate the lower electrically conductive region into parts. In embodiments, the surface area for all undercut areas in the lower electrically conductive region is less than about 20% of the surface area of the lower electrically conductive region (prior to formation of the undercut area), or less than about 5% of the surface area of the lower electrically conductive region (prior to formation of the undercut area). The phrase "surface area" refers to the surface of the lower electrically conductive region parallel to and in contact with the dielectric region.

Any suitable wet etching process can be used in the invented process. For example, the conventional wet etching process used in photolithographic process can used in this invention. The etching can be deposited by any method such as blanket coating or patterned deposition via printing on the dielectric. The device comprising the lower electrically conductive region and the dielectric region can be dipped or immersed in the etchants to perform the etching process. The etchant materials and material combinations, the compatibility of electrically conductive materials and the etchants, the concentration of etchants, and the etchant time are dependent on the lower electrically conductive material itself. In embodiments, there occurs etching of the lower electrically conductive materials with minimum side effect on the dielectric materials. In particular, the etchant time can be for example from about 1 second to about 1 hour, or from about 5 seconds to about 10 min. or from about 1 second to 60 seconds. The concentration of one component of the etchant can be for example from about 1 percent to about 90 percent by volume. The etching process can be performed at any suitable temperature for example from room temperature to about 80 degrees C., or from room temperature to about 50 degrees C., or at room temperature. To etch dual layers of lower electrically conductive region, two or more different etchants may be used. For example one etchant can be used to etch the semiconductor layer and another etchant can be used subsequently to etchant the electrodes.

The cross-sectional dimension (parallel to the dielectric region) of the undercut area is in embodiments for example from about 500 nanometers to about 4 micrometers, or from about 800 nanometers to about 2 micrometer. The depth of the undercut area (perpendicular to the dielectric region) ranges for example from about 50 nanometers to about 1 micrometer, or from about 50 nanometers to the thickness of the entire lower electrically conductive region. In contrast, the cross-sectional dimension (parallel to the dielectric region) of the pinholes is typically nanometer sized ranging for example from about 1 to about 500 nanometers. The ratio of the cross-sectional dimension of the undercut area to the thickness of the dielectric region is for example from 1:1 to about 20:1, or from about 1:1 to about 10:1. The undercut area in the lower electrically conductive region is for example at least about 5 times or at least about 10 times wider than the size of the pinhole; thus, there is no connection between the lower electrically conductive region and the upper electrically conductive region when the upper electrically conductive region is deposited on the dielectric region having the pinholes. In embodiments, the pinholes extend through the entire thickness of the dielectric region where the pinholes have a depth (perpendicular to the dielectric region) ranging for example from about 50 nanometers to about 1 micrometer.

The benefit of the pinhole undercut area approach is that in embodiments the likelihood of shorting of the electronic device is reduced even with diffusion of the upper electrically conductive region material into the pinholes since there is a gap (due to the pinhole undercut area) between the upper electrically conductive region and the lower electrically conductive region. Thus, in embodiments, the electronic device comprises an upper electrically conductive region over the dielectric region wherein the upper electrically conductive region material is present in the pinholes but in a number of the pinholes the upper electrically conductive region material fails to bridge the undercut area to contact the lower electrically conductive region. Regarding the electronic device fabrication method, in embodiments, the method comprises forming an upper electrically conductive region over the dielectric region wherein the upper electrically conductive region material enters the pinholes but in a number of the pinholes the upper electrically conductive region material fails to bridge the undercut area to contact the lower electrically conductive region.

In embodiments, the lower electrically conductive region comprises a semiconductor region and a number of electrodes. In embodiments, the upper electrically conductive region comprises a semiconductor region and a number of electrodes.

In embodiments, the electronic device is a transistor array having a failure rate that is less than about 5% due to dielectric failure. The dielectric failure can be determined by measuring the gate leakage, which is a current flow between the source and the gate electrode ($I_{GS}$). For example, if the gate leakage is higher than certain value such as 1 nA, the off current of the transistor would be higher than this value as well. If the off current of a transistor is higher than specification of off current of a transistor array, this transistor will be considered as a defect or failure. Typically, a backplane for display has a transistor array comprising more than 1000 transistors, or more than 10,000 transistors, or more than 1,000,000 transistors, or from about 1000 transistors to about 10 million transistors, depending on the display size and resolution. To improve yield of backplane, there is a need a method to reduce failure rate of transistors. Dielectric failure is one of the major reasons for transistor failure. In embodiments, the transistor array has a failure rate is less than about 3% due to dielectric failure, or less than 1% due to dielectric failure.

In embodiments, the thin film transistor exhibits an improvement in the current on/off ratio of at least about 10 times, or at least about 100 times, or from about 10 times to about 10,000 times, comparing to a transistor without the undercut using etching. In embodiments, the thin film transistors exhibits an reduction in gate leakage current by at least about 10 times, or at least about 100 times, or from about 10 times to about 10,000 times, compared to a transistors without using etching to form the undercut in the lower electrically conductive region. In embodiments, the thin film transistor exhibits an off current at least 10 times or at least 100 times, or from about 10 times to about 10,000 times, lower than the transistors without using etching to form the undercut in the lower electrically conductive region.

The invention will now be described in detail with respect to specific representative embodiments thereof, it being understood that these examples are intended to be illustrative only and the invention is not intended to be limited to the materials, conditions, or process parameters recited herein. All percentages and parts are by weight unless otherwise indicated. As used herein, room temperature refers to a temperature ranging for example from about 20 to about 25 degrees C.

Comparative Example 1

Capacitor

A copper layer about 200 nm in thick was deposited on glass substrate by vacuum evaporation. A dielectric composition was formulated by mixing 0.08 g poly(4-vinyl phenol) (PVP), 0.08 g poly(melamine-co-formaldehyde) (methylated, 84 wt % in n-butanol) as crosslinker for PVP, and 0.1 g poly (methyl silsesquioxane) (pMSSQ) (25 wt % in n-butanol) in 0.9 g n-butanol. After filtered with 0.2 micron syringe filter, the dielectric composition was spin coated on top of the copper layer at 2000 rpm for 60 s. After dried at 80° C. for 10 min, the dielectric layer was thermally annealed and crosslinked at 160° C. for 30 min. Twenty (20) capacitors were made by evaporating gold electrodes on top of the dielectric layer through shadow mask. Using a capacitor meter, the yield of capacitor was determined to be less than 30%.

Example 1

Capacitor

The copper layer (lower electrically conductive region) and the dielectric were prepared similar to Comparative Example 1. After crosslinking the dielectric layer, the device was dipped into 0.1M (NH$_4$)$_2$S$_2$O$_4$ water solution for 2 min to undercut the copper layer through pinholes in the dielectric layer. After etching, the dielectric was washed with distilled water, isopropanol, and dried. The undercut area was first examined with a microscope. One clearly saw the pinhole where the underneath copper layer was etched away so that light passed through it. Twenty (20) capacitors were made by evaporating gold electrodes (upper electrically conductive region) on top of the dielectric layer through shadow mask. The yield was determined to be 100%.

Comparative Example 2

Transistor

Bottom-gate, top-contact thin film transistors were fabricated on glass substrate. Copper (~200 nm) was evaporated as gate electrodes. The gate dielectric was formed on the copper gate similar to Comparative Example 1. A polythiophene having the following formula was used as the semiconductor:

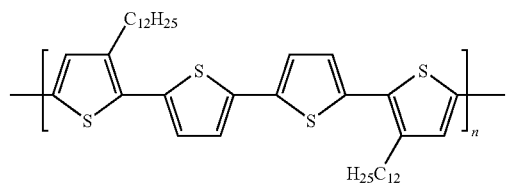

where n is a number of from about 5 to about 5,000. This polythiophene and its preparation are described in Beng Ong et al., US Patent Application Publication No. US 2003/0160230 A1, the disclosure of which is totally incorporated herein by reference. The polythiophene semiconductor layer was deposited on top of the gate dielectric on glass substrate by spin coating. The semiconductor layer was dried in a vacuum oven at about 80° C. for 30 min and annealed at 140° C. for 10 minutes, and then cooled down to room temperature. Subsequently, a set of gold source/drain electrode pairs were vacuum evaporated on top of the resulting semiconductor layer through a shadow mask to form a series of thin film transistors with various dimensions.

The resulting transistors were evaluated using a Keithley 4200 Semiconductor characterization system. Thin film transistors with channel lengths of about 90 micron and channel widths of about 1000 microns were characterized by measuring the output and transfer curves. All transistors exhibited poor performance. Only 20% transistors showed gate modulation. Off current of the transistors were high at the level of about $10^{-7}$ A, due to high gate leakage through the pinholes. Current on/off ratio of the transistors was less than 100.

Example 2

Transistors

The transistors were fabricated in a way similar to Comparative Example 2, except that etching was added. After thermal crosslinking the gate dielectric layer, the device was first dipped into 0.1M (NH$_4$)$_2$S$_2$O$_4$ water solution for 2 min to undercut the copper gate layer through pinholes in the dielectric layer, followed by washing with distilled water, isopropanol, and air-drying. After depositing the semiconductor layer and evaporated the source/drain electrodes (the upper electrically conductive region comprise the semiconductor layer and the source/drain electrodes), the transistors were evaluated using a Keithley 4200 Semiconductor characterization system. Most transistors showed good performance. The device yield was over 90% with low off current at the level of $10^{-11}$ A, and current on/off ratio about $10^5$. The off current was significantly lower and the current on/off ratio was dramatically higher than the comparative transistors It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. An electronic device comprising:
   (a) a dielectric region including a plurality of pinholes, each pinhole having an entry and an exit;
   (b) an upper electrically conductive region over the dielectric region, and comprising an upper electrically conductive region material; and
   (c) a lower electrically conductive region under the dielectric region,
   wherein at least some of the pinholes are undercut with an overhanging surface of the dielectric region around the exit facing an undercut area of the lower electrically conductive region wider than the exit; and
   wherein the upper electrically conductive region material is present in the pinholes but in a number of the pinholes, the upper electrically conductive region material fails to bridge the undercut area to contact the lower electrically conductive region.

2. The electronic device of claim 1, wherein the upper electrically conductive region comprises a semiconductor region and a number of electrodes.

3. The electronic device of claim 1, wherein the lower electrically conductive region comprises a semiconductor region and a number of electrodes.

4. The electronic device of claim 1, wherein the electronic device is a transistor array having a failure rate that is less than about 5% due to dielectric failure.

5. The electronic device of claim 1, wherein the dielectric region has a thickness ranging from about 100 nm to about 500 nm.

6. The electronic device of claim 1, wherein the lower electrically conductive region comprises aluminum, chromium, copper, gold, indium, nickel, platinum, silver, titanium, or a mixture thereof.

7. A thin film transistor comprising:
   (a) a dielectric region;
   (b) an upper electrically conductive region over the dielectric region;
   (c) a lower electrically conductive region below the dielectric region; and
   (d) a plurality of pinholes in the dielectric region, each pinhole having an entry and an exit, and each pinhole extending between the upper electrically conductive region and the lower electrically conductive region;
   wherein at least some of the pinholes are undercut with an overhanging surface of the dielectric region around the exit facing an undercut area of the lower electrically conductive region wider than the exit; and
   wherein no electrical connection is made between the lower electrically conductive region and the upper electrically conductive region through the at least some of the pinholes.

8. The thin film transistor of claim 7, wherein the upper electrically conductive region comprises a semiconductor region and a number of electrodes.

9. The thin film transistor of claim 7, wherein the lower electrically conductive region comprises a semiconductor region and a number of electrodes.

10. The thin film transistor of claim 7, wherein the thin film transistor exhibits an improvement in the current on/off ratio of at least about 10 times.

11. The thin film transistor of claim 7, wherein the dielectric region has a thickness ranging from about 100 nm to about 500 nm.

12. The thin film transistor of claim 7, wherein the lower electrically conductive region comprises aluminum, chromium, copper, gold, indium, nickel, platinum, silver, titanium, or a mixture thereof.

13. A thin film transistor comprising:
   (a) a dielectric region;
   (b) an upper electrically conductive region over the dielectric region;
   (c) a lower electrically conductive region; and
   (d) at least one pinhole in the dielectric region, the pinhole having an entry and an exit, and extending between the upper electrically conductive region and the lower electrically conductive region;
   wherein the at least one pinhole is undercut with an overhanging surface of the dielectric region around the exit facing an undercut area of the lower electrically conductive region wider than the exit; and
   wherein no electrical connection is made between the lower electrically conductive region and the upper electrically conductive region through the at least one pinhole.

* * * * *